(12) United States Patent
Tihanyi

(10) Patent No.: US 6,768,169 B2
(45) Date of Patent: Jul. 27, 2004

(54) TRANSISTOR HAVING COMPENSATION ZONES ENABLING A LOW ON-RESISTANCE AND A HIGH REVERSE VOLTAGE

(75) Inventor: Jenoe Tihanyi, Kirchheim (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/007,397

(22) Filed: Oct. 22, 2001

(65) Prior Publication Data

US 2002/0179942 A1 Dec. 5, 2002

(30) Foreign Application Priority Data

Oct. 20, 2000 (DE) .......................................... 100 52 170

(51) Int. Cl.[7] .......................... H01L 29/76; H01L 29/94; H01L 31/062; H01L 31/113; H01L 31/119
(52) U.S. Cl. ........................ 257/341; 257/342; 257/339; 257/401
(58) Field of Search .................. 257/341, 342, 257/339, 328, 329, 302, 263, 401, 173, 529, 665, 910

(56) References Cited

U.S. PATENT DOCUMENTS 6,291,856 B1 * 9/2001 Miyasaka et al. ............ 257/335
6,365,932 B1 * 4/2002 Kouno et al. ................ 257/341
6,512,268 B1 * 1/2003 Ueno .......................... 257/341
6,586,798 B1 * 7/2003 Frisina ........................ 257/328
6,673,679 B1 * 1/2004 Miyasaka et al. ........... 438/268
6,683,347 B1 * 1/2004 Fujihira ...................... 257/341

FOREIGN PATENT DOCUMENTS

DE   100 52 170.3   * 10/2000   ........... H01L/29/06
EP   1 026 754 A1   8/2000

* cited by examiner

Primary Examiner—Mary Wilczewski
Assistant Examiner—Monica Lewis
(74) Attorney, Agent, or Firm—Laurence A. Greenberg; Werner H. Stemer; Ralph E. Locher

(57) ABSTRACT

A semiconductor component includes a semiconductor body having a substrate of a first conduction type and a first layer of a second conduction type that is located above the substrate. A channel zone of the first conduction type is formed in the first layer. A first terminal zone of the second conduction type is configured adjacent the channel zone. A second terminal zone of the first conduction type is formed in the first layer. Compensation zones of the first conduction type are formed in the first layer. A second layer of the second conduction type is configured between the substrate and the compensation zones.

15 Claims, 8 Drawing Sheets

TRANSISTOR HAVING COMPENSATION ZONES ENABLING A LOW ON-RESISTANCE AND A HIGH REVERSE VOLTAGE

BACKGROUND OF THE INVENTION

1. Field of the Invention

The present invention relates to a semiconductor component, in particular a field-effect-controllable transistor.

DE 198 28 191 C1 discloses a lateral high-voltage transistor having, on an n-conducting substrate, an epitaxial layer in which source and drain zones and also a channel zone surrounding the source zone are formed. Trenches are provided in the epitaxial layer. The sidewalls of these trenches are heavily doped with a complementary dopant with respect to the rest of the epitaxial layer. A conductive channel in the channel zone can be controlled by means of a gate electrode insulated from the channel zone.

When a source-drain voltage is applied, a space charge zone propagates in this transistor—if no gate-source voltage is applied—proceeding from the source zone, and as the voltage rises, the space charge zone gradually reaches the complementarily doped sidewalls of the trenches in the direction of the drain zone. Where the space charge zone propagates, free charge carriers of the doped sidewalls of the trenches and free charge carriers of the surrounding epitaxial layer mutually compensate one another. In these regions in which the free charge carriers mutually compensate one another, a high breakdown voltage results for lack of free charge carriers. The reverse voltage of the transistor can be set by means of the doping of the trenches, the epitaxial layer preferably being highly doped, as a result of which the transistor has a low on resistance when the gate is driven.

Such transistors having a low on resistance but a high reverse voltage are currently available only as discrete components, that is to say only the transistor is realized in a semiconductor body. However, for many applications, for example for switching loads, it is desirable to integrate a transistor as a switching element and its associated drive circuit, for example using CMOS technology, in a single semiconductor body.

SUMMARY OF THE INVENTION

The semiconductor component according to the invention has a semiconductor body with a substrate of a first conduction type and, situated above the latter, a first layer of a second conduction type. In the layer of the second conduction type there is formed a channel zone of the first conduction type with a first terminal zone of the second conduction type arranged adjacent to it. Furthermore, a second terminal zone of the second conduction type is formed in the second layer. In a transistor, the first terminal zone forms the source zone and the second terminal zone forms the drain zone. The source zone is surrounded in the second layer by the channel zone, in which a conductive channel can form as a result of the application of a drive potential to a control electrode or gate electrode which is arranged in a manner insulated from the channel zone.

In order that the first layer can be highly doped for the purpose of achieving a low on resistance, and, on the other hand, in order that a high reverse voltage is achieved, compensation zones of the first conduction type are provided in the first layer, a second layer of the second conduction type being formed between these compensation zones and the substrate of the first conduction type, said second layer preferably being doped more lightly than the first layer.

In integrated circuits, the substrate is usually at a reference-ground potential. The second layer then prevents charge carriers from passing into the substrate when a high potential is applied to one of the terminal zones; in the substrate said charge carriers could pass to other circuit components in the semiconductor body, for example to a drive circuit, and interfere with their functioning. In the event of a large potential difference between one of the terminal zones and the substrate, the second layer is depleted on account of the space charge zone which then forms, that is to say the free charge carriers in the second layer and free charge carriers of the substrate and/of the compensation zones mutually compensate one another. The second layer then forms a potential barrier for free charge carriers of the first conduction type between the first layer and the substrate.

One embodiment of the invention provides a boundary zone which extends in the vertical direction of the semiconductor body. This boundary zone preferably reaches in the lower region of the semiconductor body as far as the substrate and extends in the upper region of the semiconductor body as far as the channel zone or is arranged offset with respect to the channel zone in the lateral direction of the semiconductor body and reaches as far as a first surface of the semiconductor body. The boundary zone of the first conduction type, which is thus doped complementarily with respect to the first layer, bounds the semiconductor component according to the invention in the lateral direction of the semiconductor body. A charge carrier exchange in the lateral direction is prevented by the boundary zone, as a result of which further semiconductor circuits, for example drive circuits using CMOS technology, can be realized beyond said boundary zone, the drive circuit and the semiconductor component according to the invention not mutually interfering with one another.

One embodiment of the invention provides for the compensation zones in the first layer to extend in a pillar-shaped manner in the vertical direction of the semiconductor body, in which case, according to a further embodiment, at least some of the compensation zones adjoin the channel zone. In transistors, the source zone as first terminal zone and the channel zone are usually short-circuited, so that the compensation zones adjoining the channel zone are at the same potential as the first terminal zone.

According to a further embodiment of the invention, the compensation zones are of spherical design and arranged such that they are distributed in the first layer of the second conduction type.

A further embodiment provides for the first layer of the second conduction type to be weakly doped and for more heavily doped second compensation zones of the second conduction type to be formed adjacent to the compensation zones, which, in particular, are of pillar-shaped design. When a high voltage is applied between the first and second terminal zones, the compensation zones of the first conduction type and the respectively adjacent second compensation zones of the second conduction type mutually deplete one another, that is to say the free charge carriers of the compensation zone of the first conduction type and the free charge carriers of the second compensation zone of the second conduction type mutually compensate one another.

One embodiment of the semiconductor component according to the invention provides for the second terminal zone to be formed in a well-like manner in the region of the first surface of the semiconductor body or the first layer. In this exemplary embodiment, the charge carriers move between the first and second terminal zones essentially in the lateral direction of the semiconductor body. A further embodiment provides for the second terminal zone to extend in the vertical direction of the semiconductor body as far as the second layer and to run in the region of the second layer in the lateral direction of the semiconductor body below the first terminal zone. In this embodiment, in which the lateral section of the highly doped second terminal zone runs in a manner buried in the semiconductor body and can be contact-connected by means of the vertical section at the first surface of the semiconductor body, the charge carriers move essentially in the vertical direction of the semiconductor body.

A further embodiment provides for vertical sections of the second terminal zone and the laterally running section of the second terminal zone to enclose the first terminal zones and at least some of the compensation zones in a well-like manner.

In accordance with an added feature of the invention, the first layer has a number of dopant atoms of the first conduction type and a number of dopant atoms of the second conduction type that are approximately identical.

DESCRIPTION OF THE PREFERRED EMBODIMENTS

In the figures, unless specified otherwise, identical reference symbols designate identical sections and zones with the same meaning.

Figure 1:
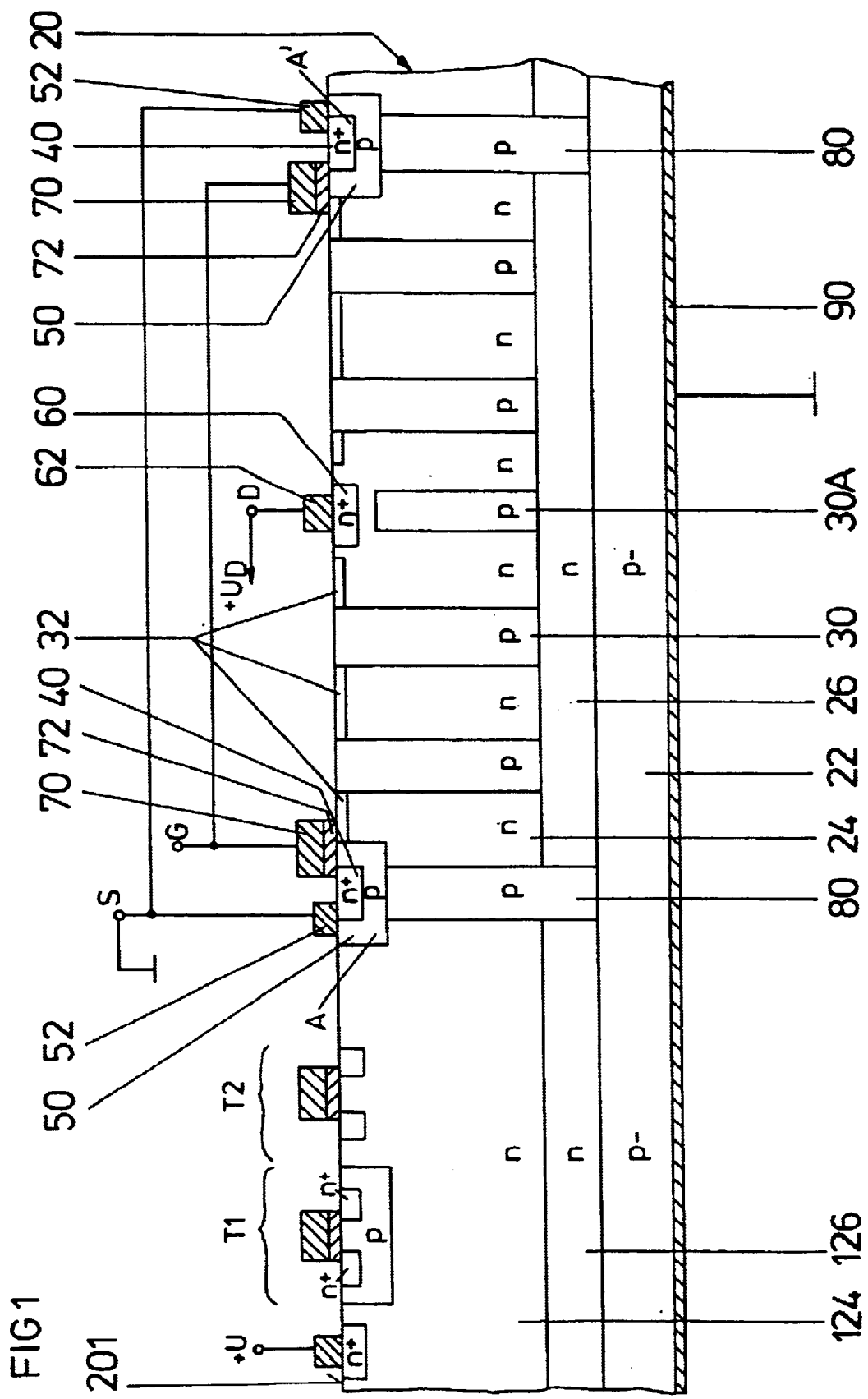
FIG. 1 is a cross sectional view of a first exemplary embodiment of a semiconductor component.
Figure 2:
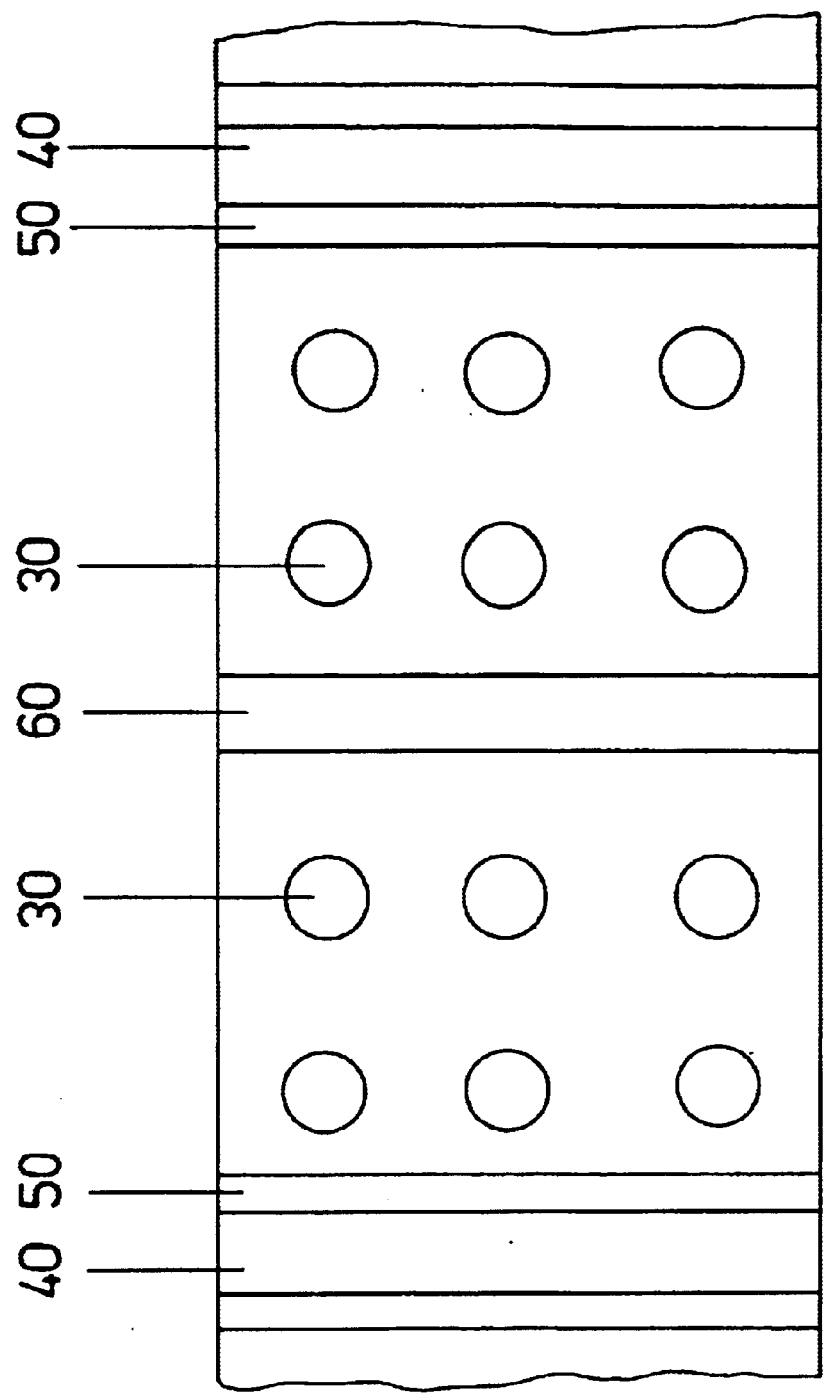
FIG. 2 is a plan view of an embodiment of a semiconductor component with elongate first terminal zones.
Figure 3:
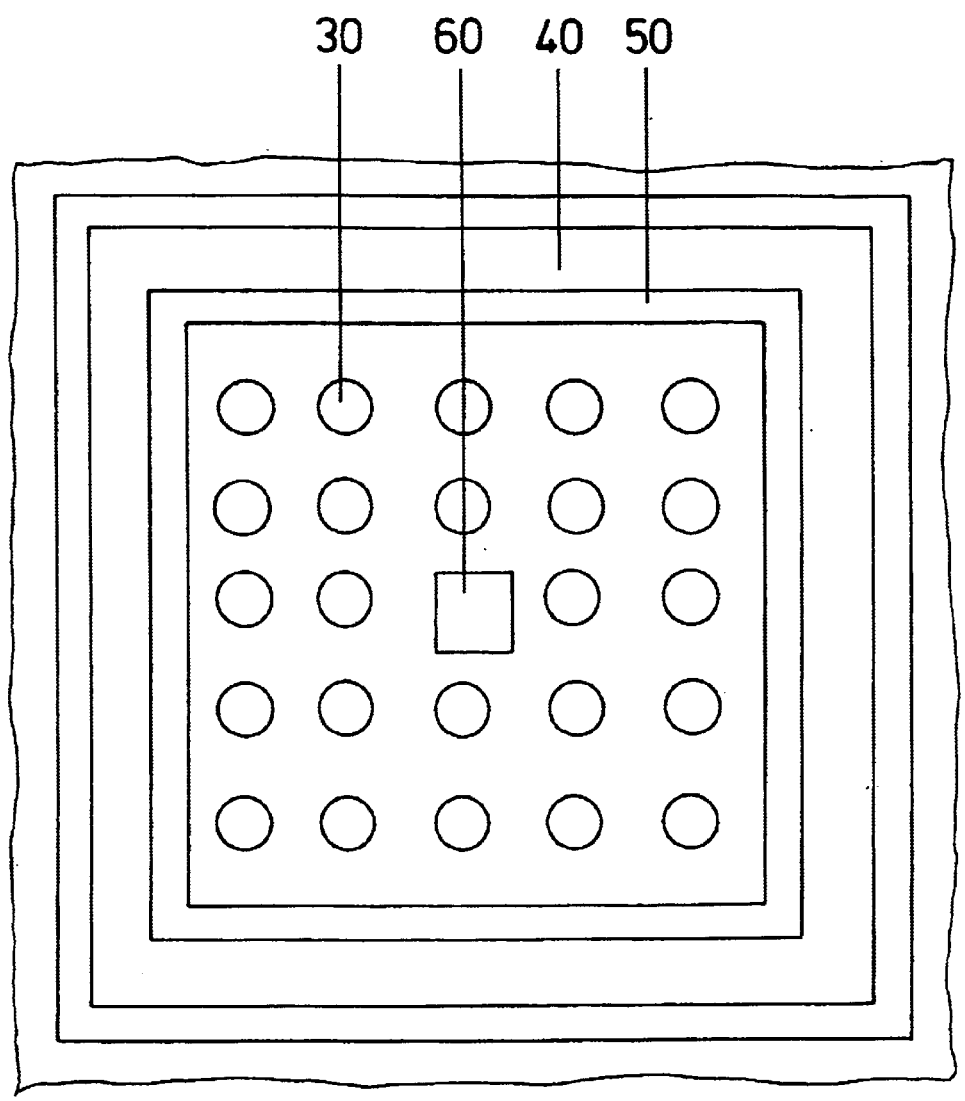
FIG. 3 is a plan view of an embodiment of a semiconductor component with an annularly closed first terminal zone.

FIG. 1 shows a semiconductor component according to the invention, designed as a MOS transistor, in a lateral sectional illustration, FIG. 2 showing a section through the semiconductor component according to FIG. 1 along the sectional plane A—A' in the case of a first embodiment, and FIG. 3 showing the semiconductor component according to FIG. 1 in a plan view of the sectional plane A—A' in the case of a second embodiment. The exemplary embodiments illustrated in FIGS. 2 and 3 do not differ in their side view, which is shown for both exemplary embodiments in FIG. 1.

The MOS transistor according to the invention has a semiconductor body 20 with a weakly p-doped substrate 22 and, situated above the latter, an n-doped first layer 24. A p-doped channel zone 50 is introduced in a well-like manner in the first layer 24, proceeding from a first surface 201, a heavily n-doped first terminal zone 40 being formed in a well-like manner in said channel zone. In this case, the first terminal zone 40 forms the source zone of the MOS transistor. In the n-doped first layer 24, a heavily n-doped second terminal zone 60 is introduced spaced apart from the channel zone 50 in the lateral direction of the semiconductor body 20, which terminal zone is likewise formed in a well-like manner proceeding from the first surface 201 in the exemplary embodiment according to FIG. 1. The second terminal zone 60 forms the drain zone of the MOS transistor. The drain zone 60 is contact-connected by means of a drain electrode 62 which is arranged on the first surface 201 and forms a drain terminal of the MOS transistor. In a corresponding manner, the source zone 40 is contact-connected by means of a source electrode 52 which short-circuits the source zone 40 and the channel zone 50 and which forms the source terminal S of the MOS transistor.

For driving the MOS transistor, provision is made of a gate electrode 70 above the channel zone 50, which is insulated from the semiconductor body 20 by means of an insulation layer 72 and which forms a gate terminal of the MOS transistor.

FIG. 1 shows, in cross section, two source zones 40 and channel zones 50, in each case in the lateral direction of the semiconductor body 20 on the left and right beside the drain zone 60. These source zones 40 are connected to one another and, as is illustrated in FIG. 2, may be designed as elongate strips in the semiconductor body 20 between which a likewise elongate drain zone 60 is formed. The elongate source zones and the elongate drain zone can extend as far as edges or edge regions of the semiconductor body. The channel zone 50 and the source zone 40 can also enclose the drain zone 60 annularly as is illustrated in FIG. 3. FIG. 1 illustrates a cross section both through the semiconductor component according to the invention according to FIG. 2 and through the semiconductor component according to the invention according to FIG. 3.

P-doped compensation zones 30 are formed in the n-doped layer 24 and, in the exemplary embodiment according to FIG. 1, extend in a pillar-shaped manner in the vertical direction of the semiconductor body 20. The cross section of these pillar shaped compensation zones 30 is circular in the exemplary embodiments according to FIGS. 2 and 3, but this cross section can assume virtually any other geometric shapes and be, for example, rectangular, square or octagonal.

In the exemplary embodiment according to FIG. 1, the pillar-shaped compensation zones 30 start at the level of the first surface 201 and extend in the vertical direction as far as a second n-conducting layer 26 formed between the compensation zones 30 and the substrate 22. In this case, this second n-conducting layer 26 is preferably doped more weakly than the first n-conducting layer 24.

Furthermore, a p-doped layer 32 is formed below the first surface 201 of the semiconductor body 20, which layer preferably reaches as far as the channel zone 50 and connects the compensation zones 30 to one another. The p-doped layer 32 preferably does not reach as far as the second terminal zone 60. Equally, a compensation zone 30A formed below the drain zone 60 does not reach as far as the drain zone 60.

The region of the first layer 24 in which the compensation zones 30 are formed forms the drift path of the MOS transistor. The MOS transistor or its drift path is bounded in the lateral direction of the semiconductor body by a p-doped boundary zone 80 which, in the exemplary embodiment according to FIG. 1, extends in the vertical direction of the semiconductor body proceeding from the channel zone 50 as far as the substrate 22. In this case, like the source zone 40 in FIG. 2, the boundary zone 80 can run below the source zone in an elongate manner as far as the edges of the semiconductor body 20 or, in accordance with the source zone 40 in FIG. 3, it can annularly surround the drift path.

The boundary zone 80, which is preferably doped more highly than the p-doped substrate 22, forms a pn junction with the first layer 24 and prevents n-type charge carriers from passing through the boundary zone 80 into n-doped zones 124 of adjacent components, or adjacent semiconductor circuits, which are represented by way of example in FIG. 1 by two CMOS transistors T1, T2 and a terminal for supply potential +U. Such a drive circuit might be, for example, a drive circuit for the MOS transistor according to the invention illustrated on the right in FIG. 1, which drive circuit is realized with the MOS transistor in the same semiconductor body.

Typical doping concentrations of the individual zones of the semiconductor component according to FIG. 1 are specified below by way of example:

| | | |
|---|---|---|
| Substrate 22: | Volume doping | $10^{14}$–$10^{15}$ cm$^{-3}$ |
| n-doped zone 124: | Volume doping | $10^{15}$–$10^{16}$ cm$^{-3}$ |
| Drain zone 60: | Volume doping | $10^{18}$–$10^{20}$ cm$^{-3}$ |
| Compensation zones 30: | Area doping | $10^{12}$ cm$^{-2}$ |
| Drift path 24: | Area doping | $10^{12}$ cm$^{-2}$ |
| Second layer 26: | Area doping | $10^{12}$ cm$^{-2}$ |
| Zone 32: | Area doping | $<10^{12}$ cm$^{-2}$ |

This MOS transistor has a low on resistance and a high breakdown voltage, the second n-conducting layer 26 preventing charge carriers from passing from the drift zone of the MOS transistor into the substrate 22, as is explained below.

If, in the MOS transistor according to the invention, a positive voltage is applied between the gate terminal G and the source terminal S, then a conductive channel forms in the channel zone 50 below the gate electrode 72. If a positive voltage is applied between the drain electrode D and the source electrode S, a charge carrier current flows in the lateral direction of the semiconductor body 20 through the drift path between the source zone 40 and the drain zone 60. The drain-source voltage is represented as voltage +$U_D$ in FIG. 1, it being assumed that the source electrode is at a reference-ground potential of the circuit, in particular ground. The on resistance $R_{on}$ of the MOS transistor is lower, the higher the doping of the first layer 24 with n-type charge carriers.

If the MOS transistor is in the off state, that is to say there is no drive potential at its gate electrode, then when a drain-source voltage is applied, a space charge zone propagates proceeding from the source zone 40 or the channel zone 50 in the drift path in the direction of the drain zone 60. This space charge zone advances in the direction of the drain zone 60 as the drain-source voltage increases. If the space charge zone reaches a compensation zone 30, then the compensation zone 30 assumes the potential of the space charge zone upon reaching the compensation zone 30. Free p-type charge carriers (holes) of this compensation zone 30 and free n-type charge carriers (electrons) from the regions of the drift path which surround the respective compensation zone mutually compensate one another. The number of free charge carriers thereby decreases in the drift path as the reverse voltage increases, or as the space charge zone extends further. The compensation of the free charge carriers means that the MOS transistor has a high reverse voltage.

In semiconductor bodies in which a plurality of semiconductor components are realized, the substrate 22 is usually at reference-ground potential. In the exemplary embodiment according to FIG. 1 the substrate 22 can be contact-connected by means of an electrically conductive layer 90, for example a metalization layer applied on the substrate. The voltage between the drain terminal 60 and the substrate 22 then corresponds to the drain-source voltage of the MOS transistor. As the drain potential +$U_D$ increases, a space charge zone propagates upward proceeding from the substrate 22, as a result of which the second n-conducting layer is depleted, that is to say the free n-type charge carriers of the second layer 26 and holes in the surrounding substrate 22 or the upwardly adjoining compensation zones 30 mutually compensate one another. The second layer 26, which is preferably doped in such a way that it can be completely depleted, thus forms a potential barrier for free charge carriers of the drift path and prevents said free charge carriers from passing into the substrate 22, where they could propagate unimpeded and interfere with the functioning of other semiconductor components integrated in the semiconductor body 20.

The dopings of the compensation zones 30, of the drift path 24 and of the second layer 26 are preferably co-ordinated with one another in such a way that the number of p-type charge carriers approximately corresponds to the number of n-type charge carriers, so that at the maximum possible reverse voltage, when the space charge zone reaches the drain zone 60 proceeding from the source zone 40, the compensation zones 30, the drift path 24 and the second layer 26 are completely depleted, that is to say no free charge carriers are present. The breakdown voltage then corresponds to the breakdown voltage of an undoped drift path 24.

The MOS transistor according to the invention, with the source zone 40, the channel zone 50 surrounding the source zone, the drain zone 60, the drift path 24 with the compensation zones 30, the boundary zone 80, an n-conducting layer 26 between the compensation zones 30 and with the substrate 22, can be integrated together with further semiconductor components in a semiconductor body. Consequently, a MOS transistor as power switch with a low on resistance and a high reverse voltage can be integrated together with its drive circuit in a semiconductor body or a chip in a space-saving manner.

Figure 4:
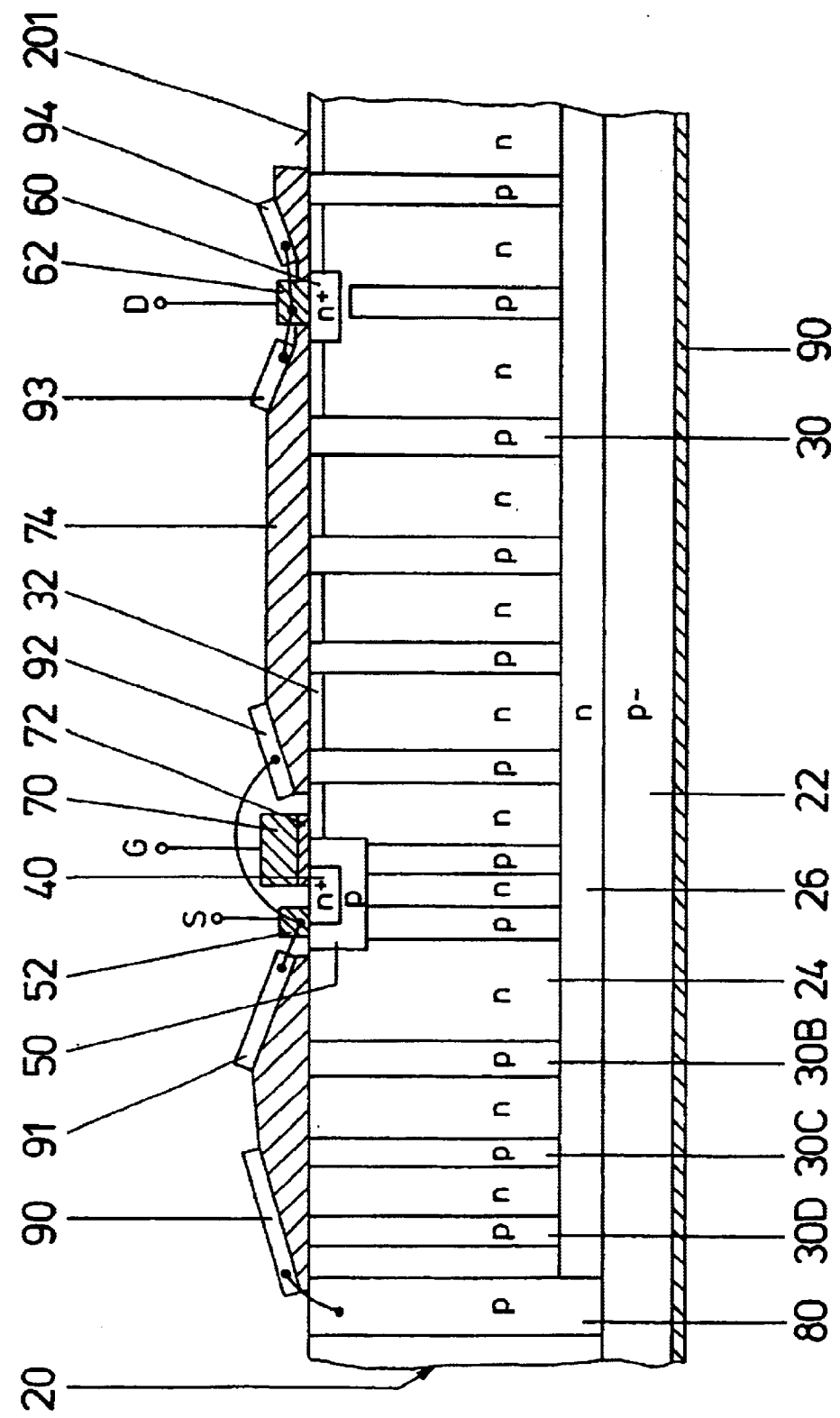
FIG. 4 is a cross sectional view of another exemplary embodiment of a semiconductor component.

FIG. 4 shows a further exemplary embodiment of a semiconductor component according to the invention in cross section. Whereas in the exemplary embodiment according to FIG. 1 the p-conducting boundary zone 80 extends as far as the substrate 22 proceeding from the channel zone 50 in the vertical direction of the semiconductor body 20, in the exemplary embodiment according to FIG. 4 the boundary zone 80 is arranged such that it is spaced apart from the channel zone 50 in the lateral direction and extends from the first surface 201 in the vertical direction of the semiconductor body 20 as far as the substrate 22. Pillar-like compensation zones 30B, 30C, 30D are formed in the n-conducting layer 24 between the channel zone 50 and the boundary zone 80, said compensation zones extending in the vertical direction of the semiconductor body 20 from the first surface 201 as far as the second n-conducting layer 26. Unlike the compensation zones 30 between the channel zone 50 and the drain zone 60, the compensation zones 30B, 30C, 30D between the channel zone 50 and the boundary zone 80 are not connected to one another by a p-conducting layer 32. Consequently, the compensation zones 30B, 30C, 30D between the channel zone 50 and the boundary zone 80 are designed in a "floating" manner in the second layer 24, that is to say they are not at a defined potential and assume the potential of a space charge zone which extends as far as the compensation zones 30 when the semiconductor component is in the off state. Discharging of the compensation zones 30B, 30C, 30D when the MOS transistor is switched on again can be effected by thermal charge carriers.

The compensation zones 30B, 30C, 30D between the channel zone 50 and the boundary zone 80 increase the breakdown voltage between the MOS transistor, which is formed within a well, formed by the boundary zone 80 and the n-conducting second layer 26, and adjacent semiconductor components, which are not illustrated in FIG. 4 for reasons of clarity.

The sectional illustration according to FIG. 4 furthermore shows field plates 90, 91, 92, 93, 94, which are arranged on the first surface 201 in a manner insulated from the semiconductor body 20 by an insulation layer 74. These field plates influence, in a known manner, the field line profile within and outside the semiconductor body and prevent a voltage breakdown in the edge regions of the MOS transistor or edges thereof. In this case, a first field plate 90 running obliquely upward is connected to the boundary zone 80, a second and third field plate 91, 92 are connected to the source terminal S and a fourth and fifth field plate 93, 94 are connected to the drain terminal D.

Figure 5:
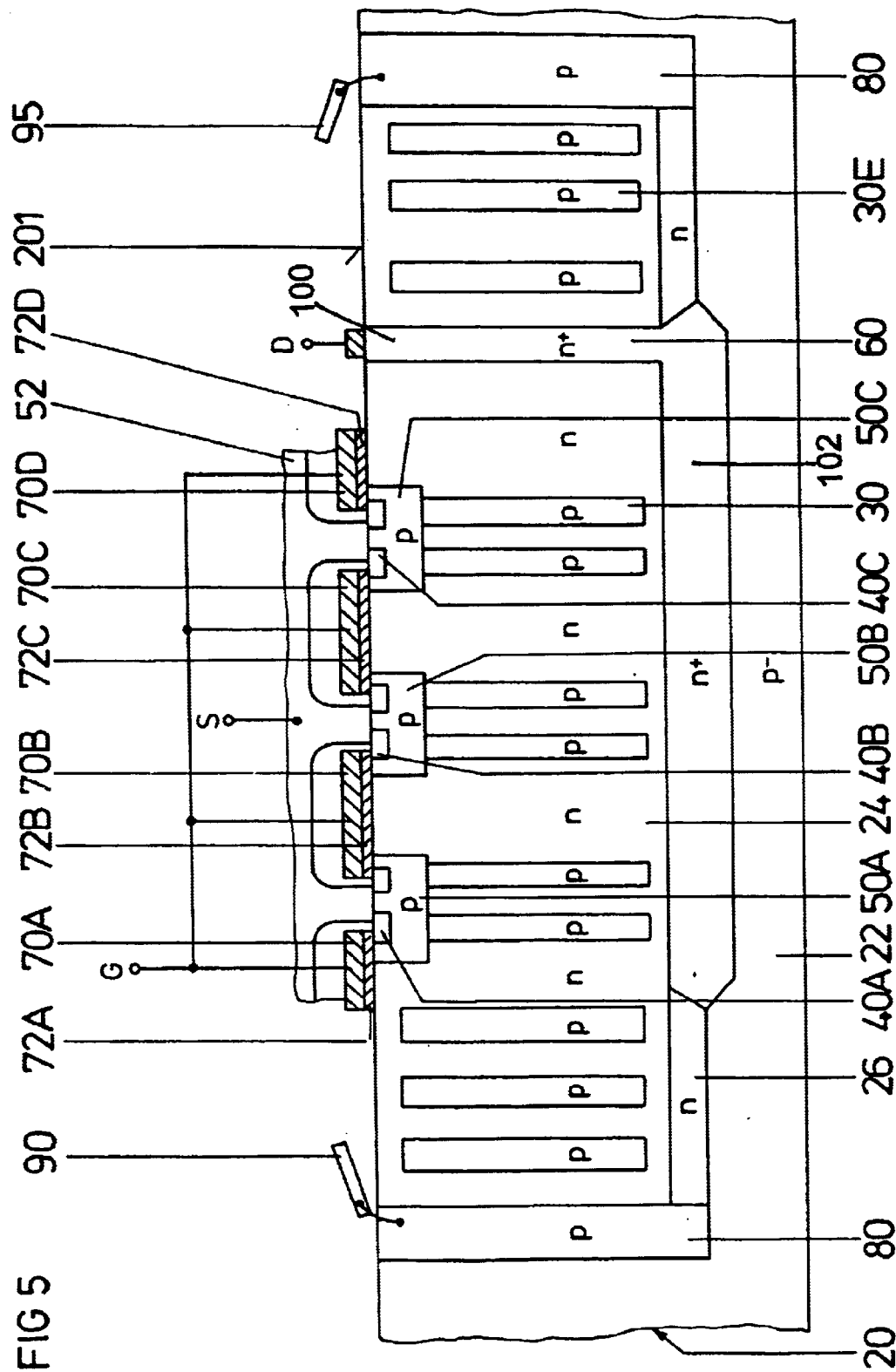
FIG. 5 is a cross sectional view of another exemplary embodiment of a semiconductor component with a plurality of first terminal zones and compensation zones running in a pillar-shaped manner.

FIG. 5 shows a further exemplary embodiment of a semiconductor component according to the invention, designed as a MOS transistor, in a lateral sectional illustration. The semiconductor component according to this exemplary embodiment has a plurality of source zones 40A, 40B, 40C and respective channel zones 50A, 50B, 50C surrounding the latter, the source zones 40A, 40B, 40C and the channel zones 50A, 50B, 50C being connected to a common source electrode 52,S. The source zones 40A, 40B, 40C are, in particular, of annular design, FIG. 5 showing a section through the center of these annular source zones.

In the component according to FIG. 5 gate electrodes 70A, 70B, 70C, 70D are arranged on the semiconductor body in a manner insulated by insulation layers 72A, 72B, 72C, 72D and are connected to a common gate electrode G. The gate electrodes 70A, 70B, 70C, 70D illustrated in FIG. 5 may be, in particular, constituent parts of a single gate electrode of grid-like design, in which case the source zones 40A, 40B, 40C, 40D with the channel zones 50A, 50B, 50C are arranged below cutouts of the grid and, in the cutouts of the grids, the source zones are contact-connected by means of the source electrode 52.

Compensation zones 30 are formed in the first n-conducting layer 24 arranged above the substrate 22, some of these compensation zones adjoining the channel zones 50A, 50B, 50C and extending in a pillar-like manner in the vertical direction of the semiconductor body 20. Other compensation zones 30E are formed between the channel zones 50A, 50C and the boundary zones 80, the boundary zones extending from the first surface 201 of the semiconductor body 20 as far as the substrate 22. In the exemplary embodiment according to FIG. 5, the drain zone 60 extends proceeding from the first surface 201 in the vertical direction as far as the n-doped second layer 26 formed between the substrate 22 and the first n-conducting layer 24. The drain zone 60 additionally extends in the lateral direction of the semiconductor body in the region of the second layer 26 below the first terminal zones 40A, 40B, 40C. Whereas in the exemplary embodiments according to FIGS. 1 to 4 the charge carrier transport runs between the source zones and the drain zones essentially in the lateral direction of the semiconductor body 20, the charge carriers in the exemplary embodiment according to FIG. 5 propagate, with the gate electrode G being driven, in the vertical direction of the semiconductor body between the source zones 40A, 40B, 40C and the laterally running section of the drain zone 60. In the exemplary embodiment according to FIG. 5, the volume of the drift path can be better utilized as a result of the larger area of the drain zone 60, at which charge carriers can be taken up from the drift path, and the larger channel area resulting from the provision of a plurality of source zones 40A, 40B, 40C and channel zones 50A, 50B, 50C. In other words, the MOS transistor according to FIG. 5 has a higher current-carrying capacity than the MOS transistors according to FIGS. 1 to 4. In the exemplary embodiment according to FIG. 5, the second layer 26 and the laterally running section of the drain zone 60 form a potential barrier for charge carriers from the drift path into the substrate 22.

The drain zone 60 has a first section 100 extending vertically to the second layer 26 and a second section 102 extending laterally at the level of the second layer 26.

Figure 6:
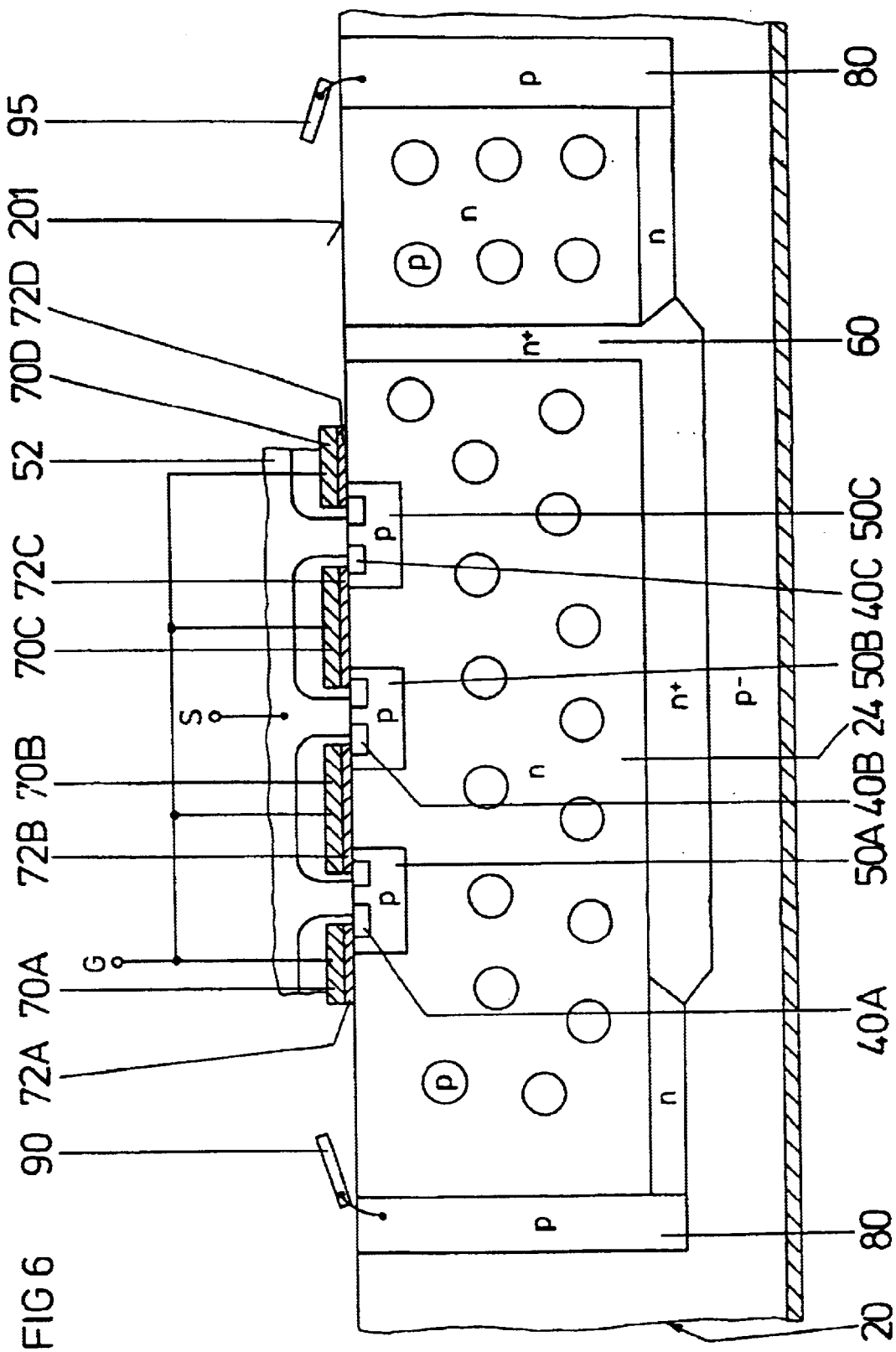
FIG. 6 is a cross sectional view of another exemplary embodiment of a semiconductor component with a plurality of first terminal zones and compensation zones of spherical design.

FIG. 6 shows a further exemplary embodiment of a semiconductor component according to the invention, which differs from that illustrated in FIG. 5 by virtue of the fact that the compensation zones 30 in the first n-conducting layer 24 are of spherical design and are arranged spaced apart from the channel zones 50A, 50B, 50C, 50D.

Figure 7:
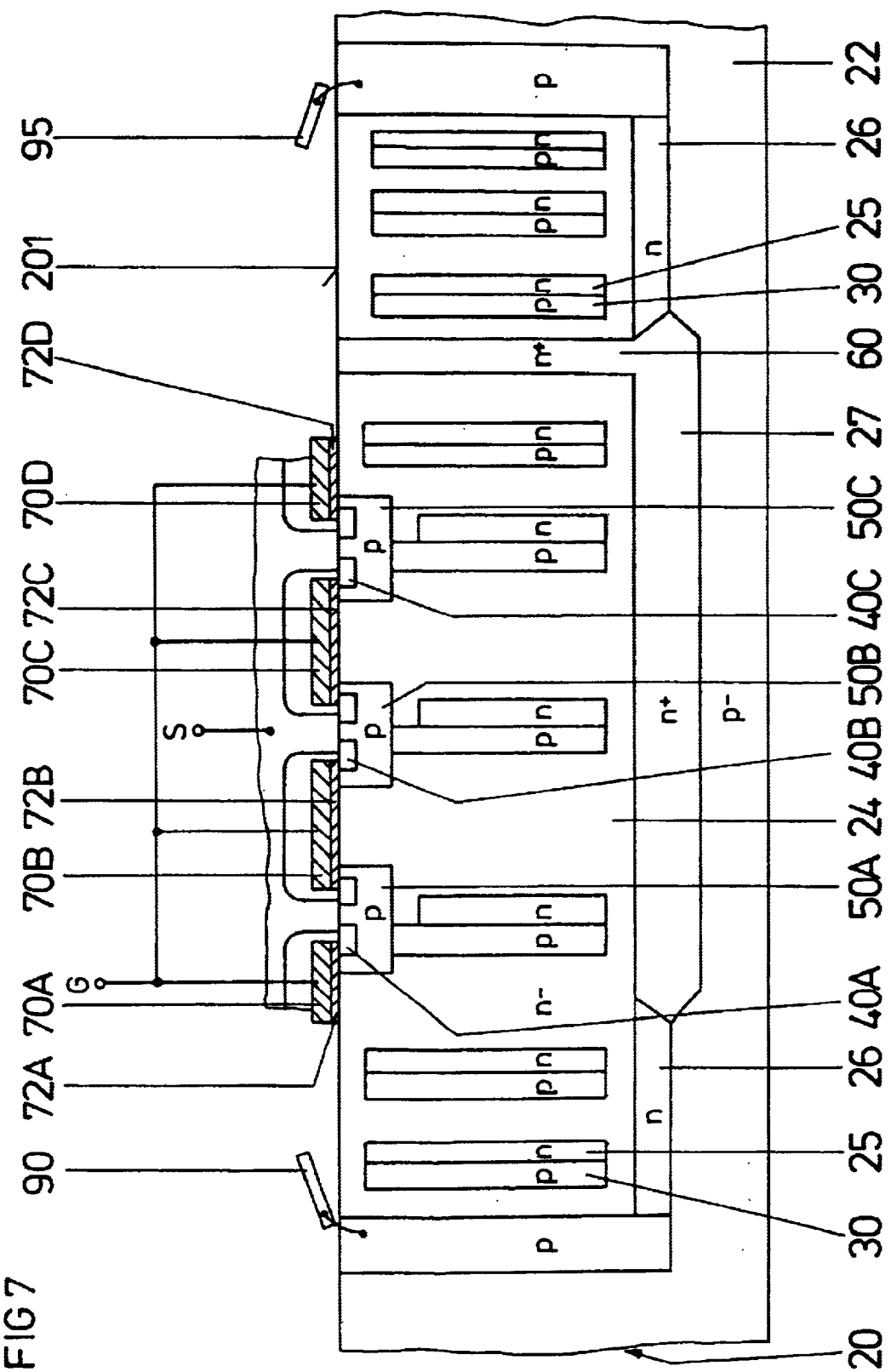
FIG. 7 is a cross sectional view of another exemplary embodiment of a semiconductor component with a plurality of first terminal zones and with first compensation zones adjacent second compensation zones.

In the exemplary embodiment according to FIG. 7, the n-conducting layer 24 is weakly n-doped, second n-conducting compensation zones 25 being formed beside the p-conducting compensation zones 30, the respectively adjacent compensation zones 30, 25 mutually depleting one another when a space charge zone propagates in the first layer 24, in order thus to bring about a high breakdown voltage of the semiconductor component. In the exemplary embodiment according to FIG. 7, some of the p-conducting compensation zones 30 are connected to the channel zones 50A, 50B, 50C and are thus at source potential.

Figure 8:
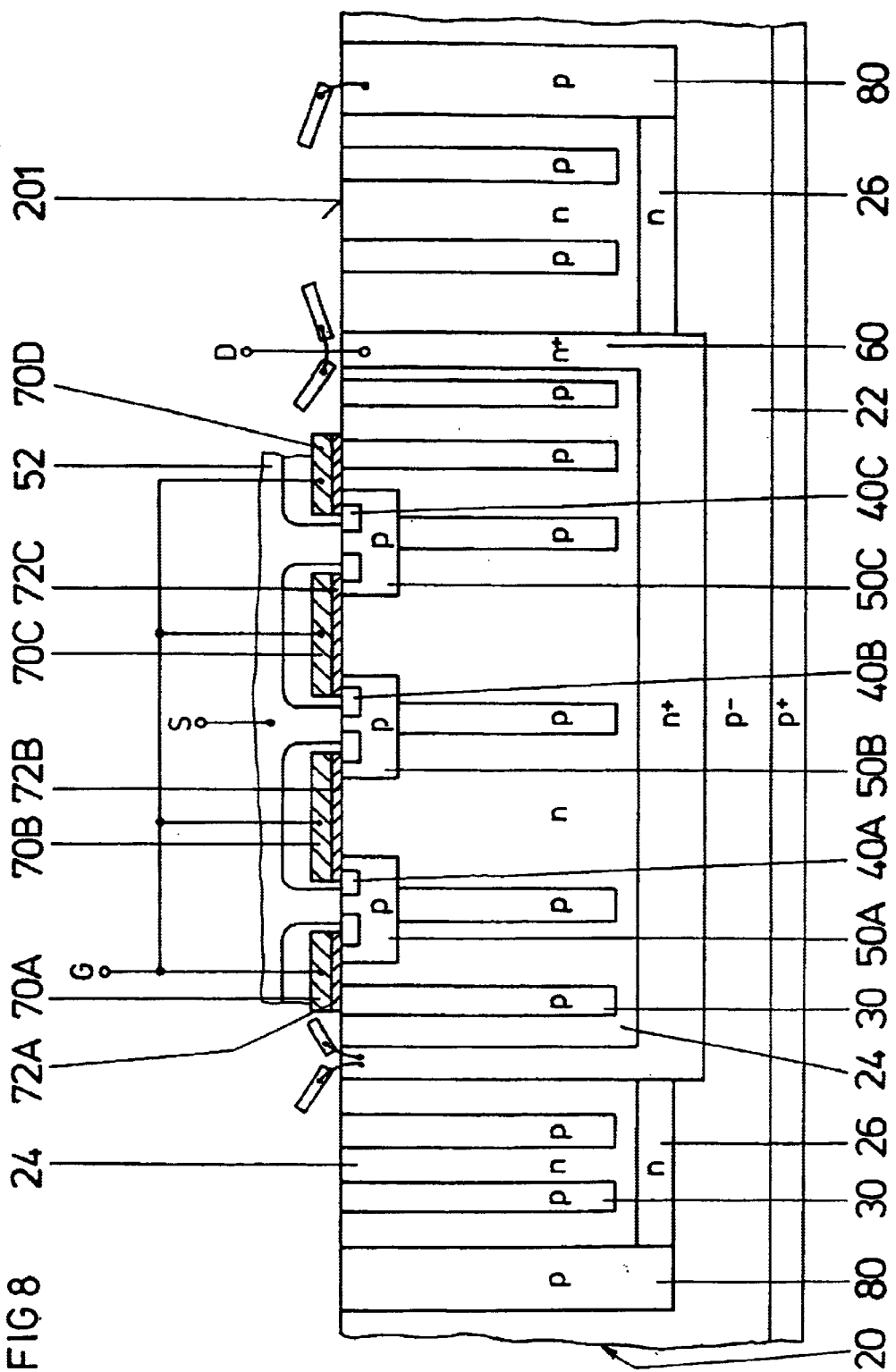
FIG. 8 is a cross sectional view of another exemplary embodiment of a semiconductor component with a plurality of first terminal zones and with a second terminal zone surrounding the first terminal zones in a well-like manner.

FIG. 8 shows a further exemplary embodiment of a semiconductor component according to the invention, in which the drain zone 60 is of U-shaped design in cross section and encloses the first terminal zones 40A, 40B, 40C and the channel zones 50A, 50B, 50C and some of the compensation zones 30. The drain zone 60 is preferably in the form of a well and encloses the first terminal zones 40A, 40B, 40C and the channel zones 50A, 50B, 50C and some of the compensation zones 30 on all sides in the lateral direction of the semiconductor body 20.

LIST OF REFERENCE SYMBOLS

20 Semiconductor body
22 Substrate
24 First n-conducting layer
26 Second n-conducting layer
30, 30A Compensation zone
32 p-conducting layer
40 Source zone
50, 50A, 50B, 50C Channel zone
52 Source electrode 60 Drain zone
62 Drain electrode
70 Gate electrode
70A, 70B, 70C, 70D Gate electrodes
72 Insulation layer
72A, 72B, 72C, 72D Insulation layers
80 Boundary zone
90 Metalization layer
90, 91, 92, 93, 94 Field plates
95 Field plate
124 n-conducting layer
126 n-conducting layer
201 First surface of the semiconductor body
T1, T2 CMOS transistors
S Source terminal
G Gate terminal
D Drain terminal
+$U_D$ Drain potential
n n-doped zone
p p-doped zone

I claim:

1. A semiconductor component comprising:

a semiconductor body having a substrate of a first conduction type and first layer of a second conduction type located above said substrate:

a channel zone of said first conduction type formed in said first layer;

a first terminal zone of said second conduction type configured adjacent said channel zone;

a second terminal zone of said first conduction type formed in said first layer;

compensation zones of said first conduction type formed in said first layer; and a second layer of said second conduction type configured between said substrate and said compensation zones.

2. The semiconductor component according to claim 1, comprising:

a boundary zone of said first conduction type extending vertically in said first layer towards said semiconductor body.

3. The semiconductor component according to claim 2, wherein said boundary zone extends from said channel zone to said substrate.

4. The semiconductor component according to claim 2, wherein said boundary zone is laterally spaced away from said channel zone.

5. The semiconductor component according to claim 4, wherein:

said semiconductor body has a first surface; and said boundary zone extends from said first surface of said semiconductor body to said substrate.

6. The semiconductor component according to claim 1, wherein said compensation zones have a pillar-shaped design.

7. The semiconductor component according to claim 6, wherein at least same of said compensation zones adjoin said channel zone.

8. The semiconductor component according to claim 1, wherein said compensation zones have a spherical design.

9. The semiconductor component according to claim 1, wherein:

said compensation zones define first compensation zones:

said first layer has second compensation zones of said second conduction type formed therein;

said second compensation zones are adjacent said first compensation zones; and said second compensation zones are doped more heavily than said second layer.

10. The semiconductor component according to claim 1, wherein said boundary zone is doped more heavily than said substrate.

11. The semiconductor component according to claim 1, wherein:

said second terminal zone has a first section extending vertically to said second layer; and said second layer laterally extends at a level;

said second terminal zone has a second section extending laterally at said level of said second layer.

12. The semiconductor component according to claim 11, wherein said first section and said second section of said second terminal zone form a well-like structure enclosing said first terminal zone and at least some of said compensation zones.

13. The semiconductor component according to claim 1, wherein:

said second terminal zone has a first section extending vertically to said second layer; and said second terminal zone has a second section extending laterally near said second layer.

14. The semiconductor component according to claim 13, wherein said first section and said second section of said second terminal zone form a well-like structure enclosing said first terminal zone and at least some of said compensation zones.

15. The semiconductor component according to claim 1, wherein said first layer has a number of dopant atoms of said first conduction type and a number of dopant atoms of said second conduction type that are approximately identical.

* * * * *